US012315555B2

(12) United States Patent
Shang et al.

(10) Patent No.: US 12,315,555 B2
(45) Date of Patent: May 27, 2025

(54) AMPLIFICATION CIRCUIT, CONTROL METHOD, AND MEMORY

(71) Applicant: CHANGXIN MEMORY TECHNOLOGIES, INC., Hefei (CN)

(72) Inventors: Weibing Shang, Hefei (CN); Hongwen Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 205 days.

(21) Appl. No.: 18/095,364

(22) Filed: Jan. 10, 2023

(65) Prior Publication Data
US 2023/0238053 A1    Jul. 27, 2023

Related U.S. Application Data

(63) Continuation of application No. PCT/CN2022/077785, filed on Feb. 24, 2022.

(30) Foreign Application Priority Data

Jan. 27, 2022 (CN) .......................... 202210101582.7

(51) Int. Cl.
*G11C 11/4091* (2006.01)
(52) U.S. Cl.
CPC ............................. *G11C 11/4091* (2013.01)
(58) Field of Classification Search
CPC .................................................. G11C 11/4091
USPC ........................................................ 365/207
See application file for complete search history.

(56) References Cited

U.S. PATENT DOCUMENTS

| 11,024,365 | B1 | 6/2021 | Seo |
| 2016/0092130 | A1 | 3/2016 | Choi et al. |
| 2018/0061461 | A1 | 3/2018 | Seo |
| 2018/0182449 | A1* | 6/2018 | Kim .................. G11C 11/4091 |
| 2018/0293029 | A1* | 10/2018 | Achtenberg ......... G11C 29/028 |

(Continued)

FOREIGN PATENT DOCUMENTS

| CN | 105469824 A | 4/2016 |
| CN | 108257631 A | 7/2018 |

(Continued)

OTHER PUBLICATIONS

US office action in U.S. Appl. No. 18/151,464, mailed on Aug. 27, 2024.

*Primary Examiner* — Huan Hoang
*Assistant Examiner* — Daniel J King
(74) *Attorney, Agent, or Firm* — Syncoda LLC; Feng Ma

(57) ABSTRACT

An amplification circuit includes a sense amplification circuit, including a read node SABL, a complementary read node SABLB, a first node PCS, and a second node NCS; an isolation circuit, coupled to the SABL, the SABLB, a hit line BL, and a complementary hit line BLB, configured to: in a sense amplification stage, couple the SABL to the BL and couple the BLB to the SABLB; an offset cancellation circuit, coupled to the BL, the BLB, the SABL, and the SABLB, configured to: in an offset cancellation stage, couple the BL to the SABLB and couple the BLB to the SABL; and a first power supply circuit, coupled to the PCS, and configured to: acquire memory temperature information, and in the offset cancellation stage, adjust, according to the memory temperature information, a magnitude of a power supply voltage provided to the PCS.

15 Claims, 11 Drawing Sheets

(56) References Cited

U.S. PATENT DOCUMENTS

| | | |
|---|---|---|
| 2018/0330766 A1 | 11/2018 | Ingalls et al. |
| 2019/0147925 A1 | 5/2019 | Choi et al. |
| 2019/0156869 A1 | 5/2019 | Ingalls et al. |
| 2019/0180811 A1 | 6/2019 | Kim et al. |
| 2020/0118609 A1 | 4/2020 | Brox et al. |
| 2020/0118614 A1 | 4/2020 | Kim et al. |
| 2020/0143869 A1 | 5/2020 | Seo et al. |
| 2020/0227111 A1 | 7/2020 | Kim et al. |
| 2020/0372948 A1 | 11/2020 | Kim et al. |
| 2021/0241818 A1 | 8/2021 | Lee |
| 2021/0272618 A1 | 9/2021 | Kim et al. |
| 2022/0172757 A1 | 6/2022 | Brox et al. |

FOREIGN PATENT DOCUMENTS

| | | |
|---|---|---|
| CN | 109767799 A | 5/2019 |
| CN | 110574109 A | 12/2019 |
| CN | 110992997 A | 4/2020 |
| CN | 111081296 A | 4/2020 |
| CN | 111161764 A | 5/2020 |
| CN | 111292783 A | 6/2020 |
| CN | 112767975 A | 5/2021 |
| CN | 112997250 A | 6/2021 |

\* cited by examiner

AMPLIFICATION CIRCUIT, CONTROL METHOD, AND MEMORY

CROSS REFERENCE TO RELATED APPLICATION

The present application is a continuation of International Application No. PCT/CN2022/077785 filed on Feb. 24, 2022, which claims priority to Chinese patent application No. 202210101582.7, entitled "AMPLIFICATION CIRCUIT, CONTROL METHOD AND MEMORY" and filed on Jan. 27, 2022, the disclosure of which is hereby incorporated by reference in its entirety.

BACKGROUND

A dynamic random access memory (DRAM) stores data through charges in a unit capacitor. The unit capacitor couples a bit line and a complementary bit line. In the DRAM, when a read write operation or a refresh operation is performed, the amplification circuit needs to read and amplify a voltage difference between the bit line and the complementary bit line.

Transistors constituting the amplification circuit may have different device characteristics due to factors such as process variations and the temperature. For example, transistors matching each other have different threshold voltages, and such different device characteristics cause generation of offset noise in the amplification circuit. Due to existence of the offset noise in the amplification circuit, the effective readout margin of the amplification circuit is decreased, which consequently decreases the performance of the DRAM.

SUMMARY

This disclosure relates to the field of semiconductor circuit design, and in particular, to an amplification circuit, a control method, and a memory.

By adding an offset cancellation stage before a sense amplification stage, offset noise in an amplification circuit is eliminated. However, the offset cancellation stage requires additional data processing time, which affects the data processing time sequence of a memory. How to reduce the processing time of the offset cancellation stage while ensuring the accuracy of offset cancellation is of great significance to the performance improvement of the memory.

An embodiment of this disclosure provides an amplification circuit, which is coupled to a bit line and a complementary bit line and includes a sense amplification circuit, an isolation circuit, an offset cancellation circuit and a first power supply circuit. The sense amplification circuit includes a read node, a complementary read node, a first node, and a second node. In a sense amplification stage and an offset cancellation stage, the first node is configured to receive a high level, and the second node is configured to receive a low level. The isolation circuit is coupled to the read node, the complementary read node, the bit line, and the complementary bit line. The isolation circuit is configured to: in the sense amplification stage, couple the read node to the bit line and couple the complementary read node to the complementary bit line. The offset cancellation circuit, is coupled to the hit line, the complementary bit line, the read node, and the complementary read node. The offset cancellation circuit is configured to: in the offset cancellation stage, couple the bit line to the complementary read node and couple the complementary hit line to the read node. The first power supply circuit is coupled to the first node, and configured to: acquire memory temperature information, and in the offset cancellation stage, adjust, according to the memory temperature information, a magnitude of a power supply voltage provided to the first node.

An embodiment of this disclosure further provides a control method, applied to the amplification circuit provided in the foregoing embodiment, the method includes: acquiring memory temperature information; and adjusting, in an offset cancellation stage, according to the memory temperature information, a magnitude of a power supply voltage provided to a first node.

An embodiment of this disclosure further provides a memory, including the amplification circuit provided in the foregoing embodiment. The amplification circuit is configured to perform a read/write operation of data.

BRIEF DESCRIPTION OF THE DRAWINGS

One or more embodiments are exemplarily described with reference to corresponding figures in the accompanying drawings, and the exemplary descriptions are not to be construed as limiting the embodiments. Unless otherwise particularly stated, the figures in the accompanying drawings are not drawn to scale. To describe the technical solutions in the embodiments of this disclosure or in the conventional technology more clearly, the following briefly introduces the accompanying drawings required for describing the embodiments. Apparently, the accompanying drawings in the following description show only some embodiments of this disclosure, and a person of ordinary skill in the art may still derive other drawings from these accompanying drawings without creative efforts.

DETAILED DESCRIPTION

Transistors constituting an amplification circuit may have different device characteristics due to factors such as process variations and the temperature. For example, transistors matching each other have different threshold voltages, and such different device characteristics cause generation of offset noise in the amplification circuit. Due to existence of the offset noise in the amplification circuit, the effective readout margin of the amplification circuit is decreased, which consequently decreases the performance of a DRAM.

By adding an offset cancellation stage before a sense amplification stage, offset noise in an amplification circuit is eliminated. However, the offset cancellation stage requires additional data processing time, which affects the data processing time sequence of a memory. How to reduce the processing time of the offset cancellation stage while ensuring the accuracy of offset cancellation is of great significance to the performance improvement of the memory.

An embodiment of this disclosure provides an amplification circuit, which dynamically adjusts a high-level voltage provided to a first node in an offset cancellation stage based on a temperature while ensuring the accuracy of offset, cancellation, thereby optimizing the performance of the memory, and reducing the power consumption of the memory.

A person of ordinary skill in the art can understand that, in the embodiments of this disclosure, many technical details are provided for readers to better understand this disclosure. However, even without these technical details and various changes and modifications based on the following embodiments, the technical solutions claimed this disclosure may still be realized. The division of the following embodiments is for convenience of description, and should not constitute any limitation to the specific implementations of this disclosure, and the various embodiments may be combined with each other without contradiction.

Figure 1:
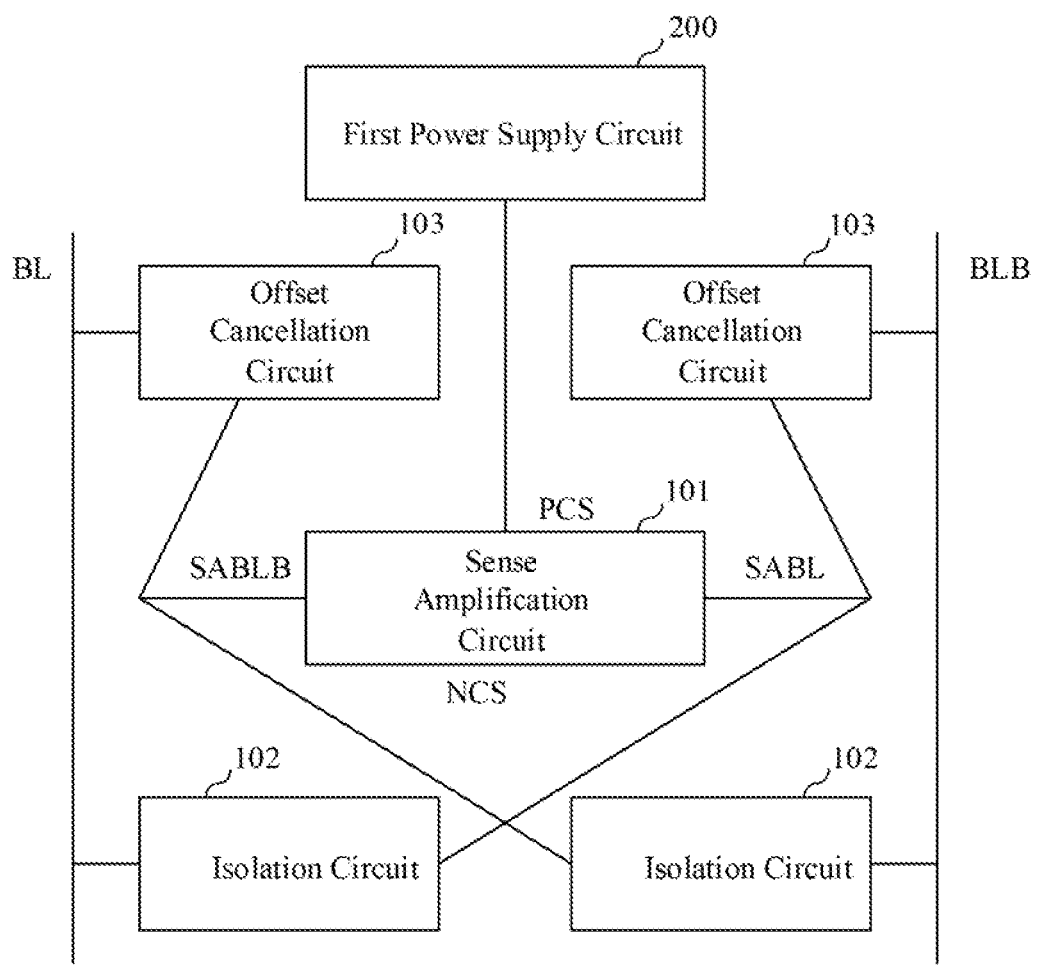
FIG. 1 is a schematic diagram of a virtual structure of an amplification circuit according to an embodiment of this disclosure.
Figure 2:
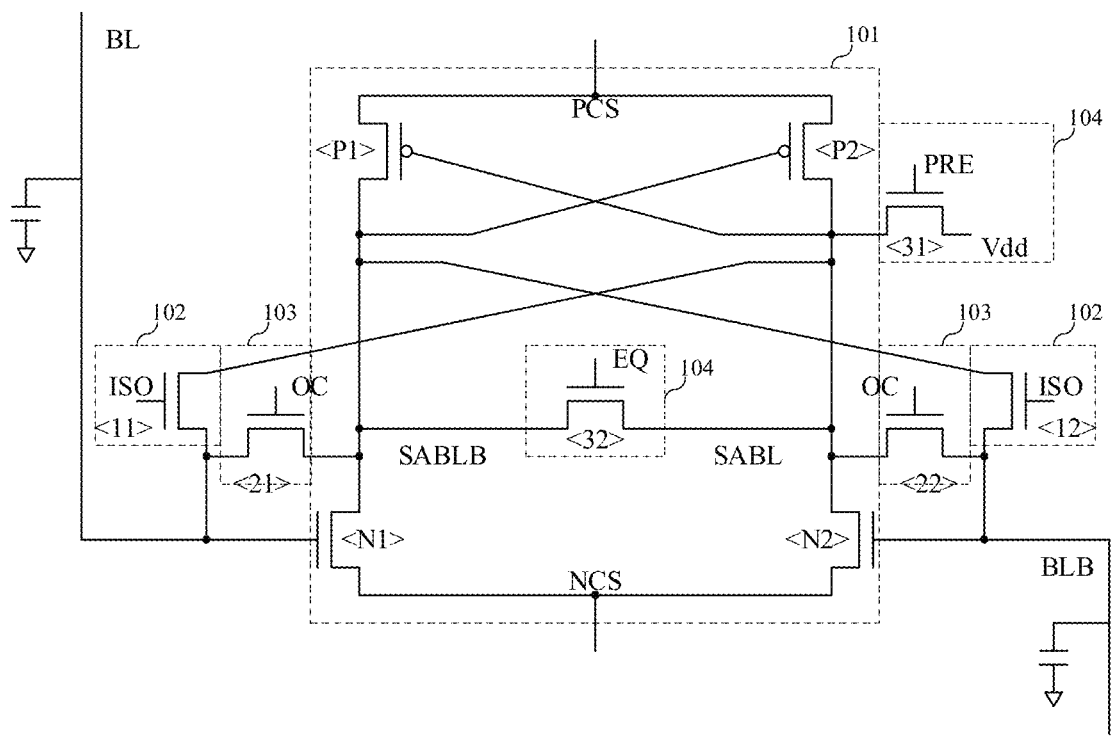
FIG. 2 is a schematic diagram of a circuit structure of an amplification circuit according to an embodiment of this disclosure.
Figure 3:
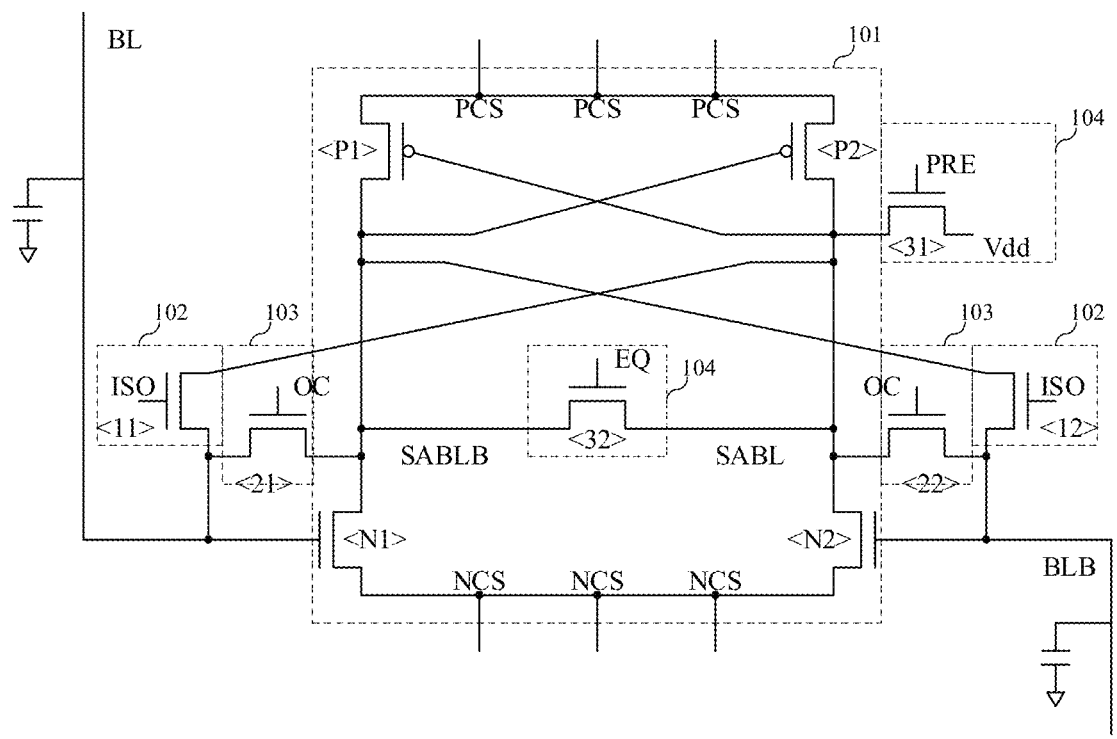
FIG. 3 is a schematic diagram of another circuit structure of an amplification circuit according to an embodiment of this disclosure.
Figure 4:
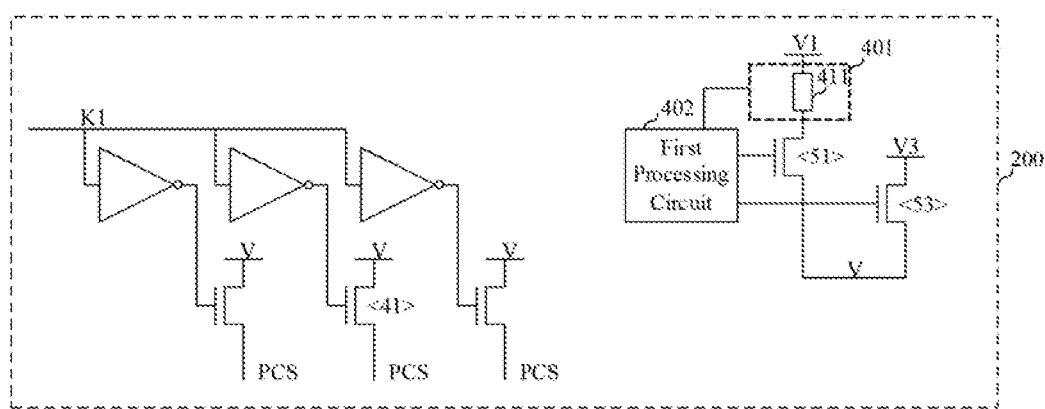
FIG. 4 is a schematic diagram of a circuit structure of a first power supply circuit according to an embodiment of this disclosure.
Figure 5:
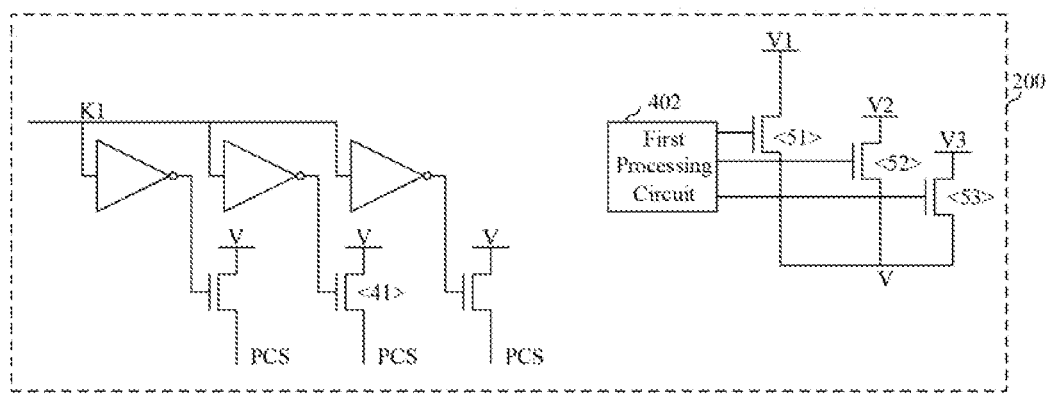
FIG. 5 is a schematic diagram of another circuit structure of a first power supply circuit according to an embodiment of this disclosure.
Figure 6:
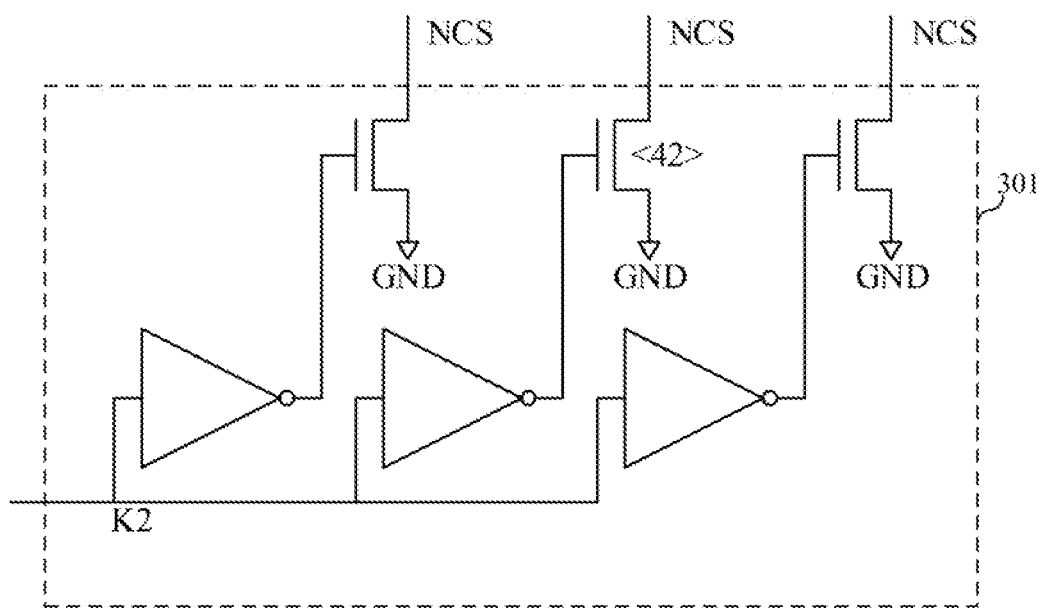
FIG. 6 is a schematic diagram of a circuit structure of a node control circuit according to an embodiment of this disclosure.
Figure 7:
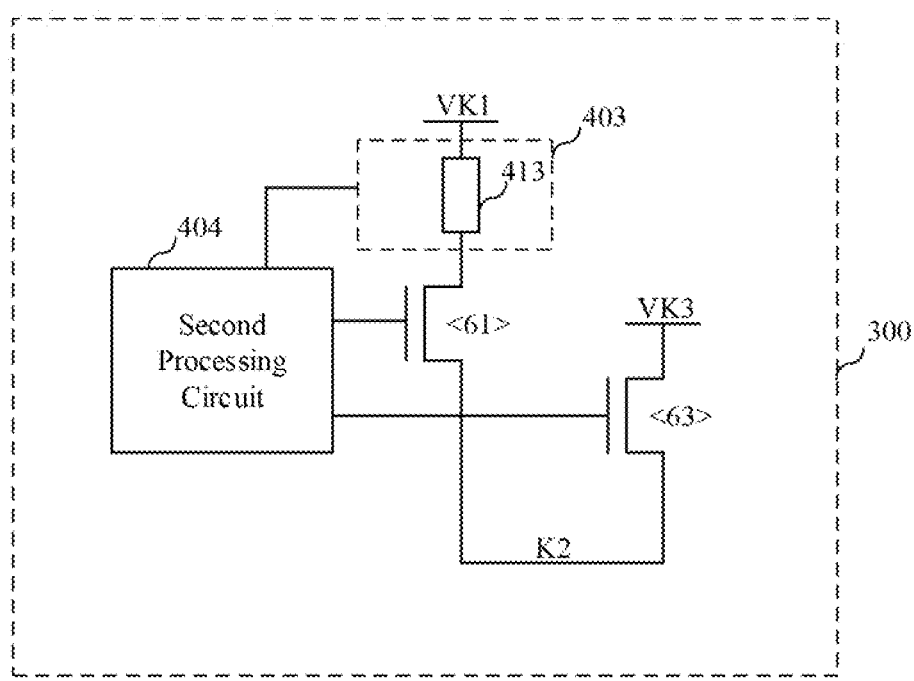
FIG. 7 is a schematic diagram of a circuit structure of a second power supply circuit according to an embodiment of this disclosure.
Figure 8:
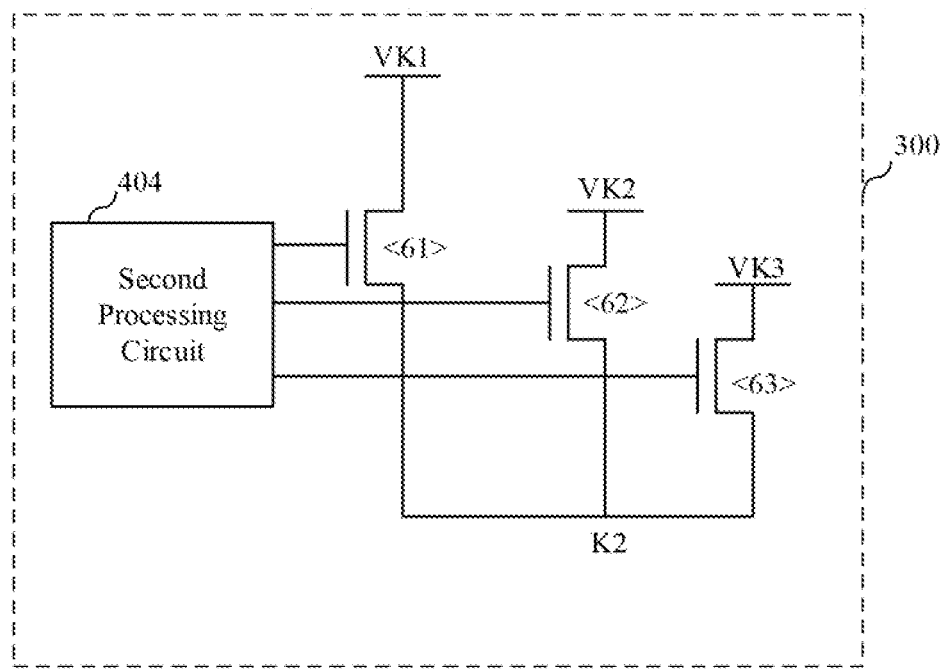
FIG. 8 is a schematic diagram of another circuit structure of a second power supply circuit according to an embodiment of this disclosure.

FIG. 1 is a schematic diagram of a virtual structure of an amplification circuit according to this embodiment; FIG. 2 is a schematic diagram of a circuit structure of an amplification circuit according to this embodiment; FIG. 3 is a schematic diagram of another circuit structure of an amplification circuit according to an embodiment of this disclosure; FIG. 4 is a schematic diagram of a circuit structure of a first power supply circuit according to an embodiment of this disclosure; FIG. 5 is a schematic diagram of another circuit structure of a first power supply circuit according to an embodiment of this disclosure; FIG. 6 is a schematic diagram of a circuit structure of a node control circuit according to an embodiment of this disclosure; FIG. 7 is a schematic diagram of a circuit structure of a second power supply circuit according, to an embodiment of this disclosure; FIG. 8 is a schematic diagram of another circuit structure of a second power supply circuit according to an embodiment of this disclosure. The following further describes the amplification circuit provided in this embodiment in detail with reference to the accompanying drawings, which is specifically as follows.

Referring to FIG. 1 to FIG. 3, an amplification circuit is coupled to a bit line BL and a complementary hit line BLB, and includes: a sense amplification circuit 101, an isolation circuit 102, an offset cancellation circuit 103 and a first power supply circuit 200.

The sense amplification circuit 101 includes a read node SABL, a complementary read node SABLB, a first node PCS, and a second node NCS. In a sense amplification stage and an offset cancellation stage, the first node PCS is configured to receive a high level, and the second node NCS is configured to receive a low level.

Specifically, the first node PCS is coupled to a power supply node to receive a high level provided by the power supply node; and the second node NCS is coupled to a ground node to receive a low level provided by the ground node.

The isolation circuit 102 is coupled to the read node SABL, the complementary read node SABLB, the bit line BL, and the complementary bit line BLB. The isolation circuit 102 is configured to: in the sense amplification stage, couple the read node SABL to the bit line BL and couple the complementary read node SABLB to the complementary bit line BLB.

The offset cancellation circuit 103 is coupled to the read node SABL, the complementary read node SABLB, the hit line BL, and the complementary bit line BLB. The offset cancellation circuit 103 is configured to: in the offset cancellation stage, couple the bit line BL to the complementary read node SABLB and couple the complementary bit line BLB to the read node SABL.

The first power supply circuit 200 is coupled to the first node PCS, and configured to: acquire memory temperature information, and in the offset cancellation stage, adjust, according to the memory temperature information, a magnitude of a power supply voltage provided to the first node PCS.

Specifically, if the memory temperature information increases, the first power supply circuit 200 is configured to reduce the magnitude of the power supply voltage provided to the first node PCS based on the memory temperature information; and if the memory temperature information decreases, the first power supply circuit 200 is configured to increase the magnitude of the power supply voltage provided to the lust node PCS based on the memory temperature information.

It should be noted that the memory temperature information is in at positive correlation with a memory temperature. That is, an increase in the memory temperature indicates higher memory temperature information, and a decrease in the memory temperature indicates lower memory temperature information. The memory temperature is a temperature of a memory to which the amplification circuit belongs. In some embodiments, the memory temperature information may alternatively be directly set to the memory temperature.

When other conditions are the same, higher memory temperature information indicates that the sense amplification circuit 101 can complete the offset cancellation and the sense amplification more quickly, and lower memory temperature information indicates that the sense amplification circuit 101 requires a longer time for completing the offset cancellation and the sense magnification. Correspondingly, when the memory temperature information increases, the magnitude of the power supply voltage provided to the first node PCS is reduced, to reduce the energy consumption in the offset cancellation stage; when the memory temperature information decreases, the magnitude of the power supply voltage provided to the first node PCS is increased, to increase a voltage difference between the first node PCS and the second node NCS in the offset cancellation stage, so as to increase a rate at which the sense amplification circuit 101 generates a compensation voltage between the bit line BL and the complementary hit line BLB. By adaptively adjusting the magnitude of the power supply voltage provided to the first node PCS according to the memory temperature information in the offset cancellation stage, dynamic adjustment on the offset cancellation time of the memory is implemented, Which not only optimizes the performance of the memory, but also reduces the power consumption of the memory.

Referring, to FIG. 2, the sense amplification circuit 101 shown in FIG. 2 merely includes one first node PCS and one second node NCS. Referring to FIG. 3, the sense amplification circuit 101 shown in FIG. 3 includes a plurality of first nodes PCS and a plurality of second nodes NCS, and the plurality of first nodes PCS and the plurality of second nodes NCS are used to provide a high level and a low level respectively. It should be noted that, the circuit structure shown in FIG. 3 is specifically described by using three first nodes PCS and three second nodes NCS as an example, which does not constitute a limitation to this embodiment.

Referring to FIG. 3 together with FIG. 4 and FIG. 5, in some embodiments, the first power supply circuit 200 further includes: first control transistors <41>, one of a pair of source/drain terminals of each first control transistor is coupled to one power supply node V, the other one of the pair of the source/drain terminals of the first control transistor is coupled to one first node PCS, and a gate of the first control transistor is configured to receive a pull-up control signal K1. Specifically, the pull-up control signal K1 is provided by a memory to which the amplification circuit belongs. In the offset cancellation stage and the sense amplification stage, the memory provides the pull-up control signal K1 to turn on the first control transistors <41>, to couple the power supply nodes V to the first nodes PCS.

In addition, this embodiment is described based on the circuit shown in FIG. 3, so that there are three controllers adapted to the three first nodes PCS in the circuit shown in FIG. 3 to realize control on the three first control transistors <41>. In some embodiments, the pull-up control signal K1 is further configured to select and turn on a first control transistor <41>.

In an example, referring to FIG. 4, the first power supply circuit 200 includes a first power supply, a first transmission circuit and a first processing circuit.

The first power supply is configured to provide a first voltage V1.

One end of the first transmission circuit 401 is coupled to the first power supply, and the other end of the first transmission circuit 401 is coupled to the first node PCS. The first transmission circuit 401 is configured to perform voltage division on the first voltage V1 to provide a power supply voltage to the first node.

The first processing circuit 402 is coupled to the first transmission circuit 401. The first processing circuit 402 is configured to: acquire the memory temperature information, and in the offset cancellation stage, adjust, using a first adjustment signal according to the memory temperature information, a magnitude of the voltage division performed by the first transmission circuit 401 on the first voltage V1.

In some embodiments, the first transmission circuit 401 includes a first adjustment resistor 411, one end of the first adjustment resistor 411 is coupled to the first power supply, and the other end thereof is coupled to the first node PCS. The first transmission circuit 401 is configured to: change a magnitude of an resistance value of the first adjustment resistor 411 according to the 17 adjustment signal, to perform the voltage division on the first voltage V1 to provide the power supply voltage to the first node PCS. In some other embodiments, the first transmission circuit 401 is configured to perform a logical operation on the first adjustment signal, so as to select and control the magnitude of the voltage division on the first voltage V1, so as to perform the voltage division on the first voltage V1 to provide the power supply voltage to the first node PCS. It should be noted that, if the first power supply circuit 200 has a first control transistor <41>, when the first control transistor <41> is turned on, the first transmission circuit 401 is coupled to the first node PCS via the power supply node V; and if the first lower supply circuit 200 has no first control transistor <41>, the first transmission circuit 401 is directly coupled to the first node PCS.

In this embodiment, the first power supply circuit 200 further includes a third power supply for providing a third voltage V3. The third power supply is configured to provide the third voltage to the first node PCS in the sense amplification stage, to achieve independent control on the sense amplification stage and the offset cancellation stage. Correspondingly, the first power supply circuit 200 further includes: a first selection transistor <51> and a third selection transistor <53>. One of a pair of source/drain terminals of the first selection transistor <51> is coupled to the first power supply, the other one of the pair of the source/drain terminals thereof is coupled to the power supply node and a gate thereof is coupled to the first processing circuit 402 and configured to receive a first selection signal. One of a pair of source/drain terminals of the third selection transistor <53> is coupled to the third power supply, the other one of the pair of the source/drain terminals thereof is coupled to the power supply node V and a gate thereof is coupled to the first processing circuit 402 and configured to receive a third selection signal. Specifically, the first selection transistor <51> is turned on based on the first selection signal, to couple the first power supply to the power supply node V; and the third selection transistor <53> is turned on based on the third selection signal, to couple the third power supply to the power supply node V.

In some embodiments, the first processing circuit 402 includes: a temperature acquisition subcircuit, a first configuration circuit and a first processing subcircuit. The temperature acquisition subcircuit is configured to acquire the memory temperature information. The first configuration circuit has stored thereon a correspondence between the memory temperature information and adjustment parameters. The adjustment parameters are used to control the magnitude of the voltage division performed by the first transmission circuit 401 on the first voltage V1. The first processing subcircuit is coupled to the temperature acquisition subcircuit, the first configuration circuit, and the first transmission circuit 401. The first processing subcircuit is configured to: acquire an adjustment parameter based on the memory temperature information and the correspondence, and configure the first adjustment signal based on the adjustment parameter, to control the first transmission circuit 401. By setting different adjustment parameters for different memory temperature information, the accuracy of providing different voltages to the first node PCS according to the temperature adjustment in the sense amplification stage is fiuther improved.

In some embodiments, the first processing circuit 402 includes: a temperature acquisition subcircuit, a first configuration circuit and a first processing subcircuit. The temperature acquisition subcircuit is configured to acquire the memory temperature information. The first configuration circuit has stored thereon a correspondence between intervals to which the memory temperature information belongs to and adjustment parameters, the adjustment parameters are used to control the magnitude of the voltage division performed by the first transmission circuit 401 on the first voltage V1. The first processing subcircuit is coupled to the temperature acquisition subcircuit, the first configuration circuit, and the first transmission circuit 401. The first processing subcircuit is configured to: acquire an adjustment parameter based on the memory temperature information and the correspondence, and configure the first adjustment signal based on the adjustment parameter, to control the first transmission circuit 401. By setting different adjustment parameters for different intervals to which the memory temperature information belongs, the workload of providing different voltages to the first node PCS according to the temperature adjustment in the sense amplification stage is reduced.

In another example, referring to FIG. 5, the first power supply circuit 200 includes: a first power supply, a second power supply and a first processing circuit 402.

The first power supply is configured to provide a first voltage V1.

The second power supply is configured to provide a second voltage V2, the first voltage V1 being higher than the second voltage V2.

The first processing circuit 402 is coupled to the first node PCS, the first power supply, and the second power supply. The first processing circuit 402 is configured to: acquire the memory temperature information, and in the offset cancellation stage, select and couple, according to the memory temperature information, the first power supply or the second power supply to the first node PCS.

Specifically, the first processing circuit 402 includes: a temperature acquisition subcircuit and a first processing subcircuit. The temperature acquisition subcircuit is configured to acquire the memory temperature information. The first processing subcircuit is coupled to the temperature acquisition subcircuit, the first node PCS, the first power supply, and the second power supply. The first processing subcircuit is configured to: if the memory temperature information is greater than a preset temperature, select and couple the second power supply to the first node PCS in the offset cancellation stage; and if the memory temperature information is less than the preset temperature, select and couple the first power supply to the first node PCS in the offset cancellation stage.

More specifically, the first processing subcircuit is configured to: if the memory temperature information is greater than the preset temperature, provide a second selection signal in the offset cancellation stage, and if the memory temperature information is less than the preset temperature, provide a first selection signal in the offset cancellation stage. The first power supply circuit 200 further includes: a first selection transistor <51> and a second selection transistor <52>. One of a pair of source/drain terminals of the first selection transistor <51> is coupled to the first power supply, the other one of the pair of the source/drain terminals thereof is coupled to the power supply node V, and a gate thereof is coupled to the first processing circuit 402 and configured to receive a first selection signal. One of a pair of source/drain terminals of the second selection transistor <52> is coupled to the second power supply, the other one of the pair of the source/drain terminals thereof is coupled to the power supply node V, and a gate thereof is coupled to the first processing circuit 402 and configured to receive the second selection signal. Specifically, the first selection transistor <51> is turned an based on the first selection signal, to couple the first power supply to the power supply node V, and the second selection transistor <52> is turned on based on the second selection signal, to couple the second power supply to the power supply node V.

It should be noted that, if the first power supply circuit 200 has a first selection transistor <51> and a second selection transistor <52>, the first node PCS may be coupled to the first voltage V1 or the second voltage V2 via the power supply node V; and if the first power supply circuit 200 has only the first selection transistor <51>, the first node PCS may be coupled to only the first voltage V1.

In this embodiment, the first power supply circuit 200 further includes a third power supply, configured to provide a third voltage V3. The third power supply is configured to provide the third voltage V3 to the first node PCS in the sense amplification stage, to achieve independent control on the sense amplification stage and the offset cancellation stage. Correspondingly, the first power supply circuit 200 further includes: a third selection transistor <53>. One of a pair of source/drain terminals of the third selection transistor <53> is coupled to the third power supply, the other one of the pair of the source/drain terminals thereof is coupled to the power supply node V, and a gate thereof is coupled to the first processing circuit 402 and configured to receive a third selection signal. Specifically, the third selection transistor <53> is turned on based on the third selection signal, to couple the third power supply to the power supply node V. In some embodiments, the third power supply may alternatively be the second power supply. That is, the second voltage V2 is provided to the first node PCS in the sense amplification stage.

It should be noted that, the first selection transistor <51>, the second selection transistor <52>, and the third selection transistor <53> may be NMOS tubes or PMOS tubes. Because the pull-up capability of the PMOS tubes is stronger than the pull-up capability of the NMOS tubes, the first selection transistor <51>, the second selection transistor <52>, and the third selection transistor <53> are PMOS tubes in this embodiment.

In some embodiments, referring to FIG. 6 to FIG. 8, the amplification circuit further includes a node control circuit 301 and a second power supply circuit 300.

Referring to FIG. 6, the node control circuit 301 is coupled to the second node NCS and a ground node GND. The node control circuit 301 is configured to couple the second node NCS to the ground node GND in the offset cancellation stage and the sense amplification stage.

Referring to FIG. 7 and FIG. 8, the second power supply circuit 300 is coupled to the node control circuit 301, and configured to: acquire the memory temperature information, and in the offset cancellation stage, control, according to the memory temperature information, the node control circuit 301 to couple the second node NCS to the ground node GND.

When other conditions are the same, higher memory temperature information indicates that the sense amplification circuit 101 can complete the offset cancellation and the sense amplification more quickly, and lower memory temperature information indicates that the sense amplification circuit 101 requires a longer time for completing the offset cancellation and the sense magnification. Correspondingly, when the memory temperature information increases, the pull-down capability of the second node NCS is reduced, to reduce the energy consumption in the offset cancellation stage; and when the memory temperature information decreases, the pull-down capability of the second node NCS is increased, to improve a rate at which the sense amplification circuit 101 generates a compensation voltage before performing voltage amplification. By adaptively adjusting the pull-down capability of the second node NCS according to the memory temperature information in the offset cancellation stage, dynamic adjustment on the offset cancellation time of the memory is implemented, which not only optimizes the performance of the memory, but also reduces the power consumption of the memory.

Referring to FIG. 3 together with FIG. 6, in some embodiments, the node control circuit 301 includes: second control transistors <42>. One of a pair of source/drain terminals of each second control transistor is coupled to one ground node GND, the other one of the pair of the source/drain terminals of the second control transistor is coupled to a second node NCS, and a gate of the second control transistor is configured to receive a pull-down control signal K2. Specifically, the pull-down control signal K2 is provided by the second power supply circuit 300. In the offset cancellation stage and the sense amplification stage, the second power supply circuit 300 provides the pull-down control signal K2 to turn on the second control transistor <42>, to couple the around node GND to the second node NCS.

In addition, this embodiment is described based on the circuit shown in FIG. 3, so that there are three controllers adapted to the three second nodes NCS in the circuit shown in FIG. 3, to realize control on the three second control transistors <42>. In some embodiments, the pull-down control signal K2 is further configured to select and turn On a second control transistor <42>.

In an example, referring to FIG. 7, the second power supply circuit 300 includes: a first control power supply, a second transmission circuit 403 and a second processing circuit 404.

The first control power supply is configured to provide a first control voltage VK1.

One end of the second transmission circuit 403 is coupled to the first control power supply, and the other end thereof is coupled to the node control circuit 301, where the second transmission circuit 403 is configured to perform the voltage division on the first control voltage VK1.

The second processing circuit 404 is coupled to the second transmission circuit 403. The second processing circuit 404 is configured to: acquire the memory temperature information, and in the offset cancellation stage, adjust, using a second adjustment signal according to the memory temperature information, a magnitude of the voltage division per by the second transmission circuit 403 on the first control voltage VK1.

In some embodiments, the second transmission circuit 403 includes a second adjustment resistor 413, one end of the second adjustment resistor 413 is coupled to the first control power supply, and the other end thereof is coupled to the node control circuit 301. The second transmission circuit 403 is configured to: change a magnitude of an resistance value of the second adjustment resistor 413 according to the second adjustment signal, to perform voltage division on the first control voltage VK1, so as to provide the pull-down control signal K2 to the node control circuit 301. In some other embodiments, the second transmission circuit 403 is configured to perform a logical operation on the second adjustment signal, so as to select and control the magnitude of the voltage division on the first control voltage VK1, so as to perform the voltage division on the first control voltage VK1 to provide the pull-down control signal K2 to the node control circuit 301. The logical operation may include amplifying or reducing the second adjustment signal with a fixed factor.

In this embodiment, the second power supply circuit 300 further includes: a third control power supply, which is configured to provide a third control voltage VK3. The third control power supply is configured to provide pull-down control signal K2 based on the third control voltage VK3 in the sense amplification stage, to achieve independent control on the sense amplification stage and the offset cancellation stage. Correspondingly, the second power supply circuit 300 further includes: a first strobe transistor <61> and a third strobe transistor <63>. One of a pair of source/drain terminals of the first strobe transistor <61> is coupled to the first control power supply, the other one of the pair of the source/drain terminals thereof is coupled to the node control circuit 301, and a gate thereof is coupled to the second processing circuit 404 and configured to receive a fourth selection signal. One of a pair of source/drain terminals of the third strobe transistor <63> is coupled to the third control power supply, the other one of the pair of the source/drain terminals thereof is coupled to the node control circuit 301, and a gate thereof is coupled to the second processing circuit 404 and configured to receive a sixth selection signal. Specifically, the first strobe transistor <61> is turned on based on the fourth selection signal, to provide the pull-down control signal K2 to the node control circuit 301, and the third strobe transistor <63> is turned on based on the sixth selection signal, to provide the pull-down control signal K2 to the node control circuit 301.

In some embodiments, the second processing circuit 404 includes: a temperature acquisition subcircuit, a second configuration circuit a second configuration circuit. The temperature acquisition subcircuit is configured to acquire the memory temperature information. The second configuration circuit has stored thereon a correspondence between the memory temperature information and adjustment parameters. The adjustment parameter is used to control the magnitude of voltage division performed by the second transmission circuit 403 on the first control voltage VK1. The second processing subcircuit is coupled to the temperature acquisition subcircuit, the second configuration circuit, and the second transmission circuit 403. The second processing subcircuit is configured to: acquire the adjustment parameter based on the memory temperature information and the correspondence, and configure the second adjustment signal based on the adjustment parameter, to control the second transmission circuit 403. By setting different adjustment parameters for different memory temperature information, the accuracy of adjusting the pull-down capability of the second node NCS according to the temperature in the sense amplification stage is further improved.

In some embodiments, the second processing circuit 404 includes: a temperature acquisition subcircuit, a second configuration circuit and a second processing subcircuit. The temperature acquisition subcircuit is configured to acquire the memory temperature information. The second configuration circuit has stored thereon a correspondence between intervals to which the memory temperature information belongs to and adjustment parameters. The adjustment parameter is used to control the magnitude of voltage division performed by the second transmission circuit 403 on the first control voltage VK1. The second processing subcircuit is coupled to the temperature acquisition subcircuit, the second configuration circuit, and the second transmission circuit 403. The second processing subcircuit is configured to: acquire the adjustment parameter based on the memory temperature information and the correspondence, and configure the second adjustment signal based on the adjustment parameter, to control the second transmission circuit 403. By setting different adjustment parameters for different intervals to which the memory temperature information belongs to, the workload of adjusting the pull-down capability of the second node NCS according to the temperature in the sense amplification stage is reduced.

In another example, referring to FIG. 8, the second power supply circuit 300 includes: a first control power supply, a second control power supply and a second processing circuit 404.

The first control power supply is configured to provide a first control voltage VK1.

The second control power supply is configured to provide a second control voltage VK2. The first control voltage VK1 is higher than the second control voltage VK2.

The second processing circuit 404 is coupled to the node control circuit 301, the first control power supply, and the second control power supply. The second processing circuit 404 is configured to: acquire the memory temperature information, and in the offset cancellation stage, select and couple, according to the memory temperature information, the first control power supply or the second control power supply to the node control circuit 301.

Specifically, the second processing circuit 404 includes: a temperature acquisition subcircuit and a second processing subcircuit. The temperature acquisition subcircuit is configured to acquire the memory temperature information. The second processing subcircuit is coupled to the temperature acquisition subcircuit, the node control circuit 301, the first control power supply, and the second control power supply. The second processing subcircuit is configured to: if the memory temperature information is greater than a preset temperature, select and couple the second control power supply to the node control circuit 301 in the offset cancellation stage; and if the memory temperature information is less than the preset temperature, select and couple the first control power supply to the node control circuit 301 in the offset cancellation stage.

More specifically, the second processing subcircuit is configured to: if the memory temperature information is greater than the preset temperature, provide a fifth selection signal in the offset cancellation stage; and if the memory temperature information is less than the preset temperature, provide the fourth selection signal in the offset cancellation stage. The second power supply circuit 300 further includes: a first strobe transistor <61> and a second strobe transistor <62>. One of a pair of source/drain terminals of the first strobe transistor <61> is coupled to the first control power supply, the other one of the pair of the source/drain terminals thereof is coupled to the node control circuit 301, and a gate thereof is coupled to the second processing circuit 404 and configured to receive the fourth selection signal. One of a pair of source/drain terminals of the second strobe transistor <62> is coupled to the second control power supply, the other one of the pair of the source/drain terminals thereof is coupled to the node control circuit 301, and a gate thereof is coupled to the second processing circuit 404 and configured to receive the fifth selection signal. Specifically, the first strobe transistor <61> is turned on based on the fourth selection signal, to couple the first control power supply to the node control circuit 301; and the second strobe transistor <62> is turned on based on the fifth selection signal, to couple the second control power supply to the node control circuit 301.

In this embodiment, the second power supply circuit 300 further includes: a third control power supply, configured to provide a third control voltage VK3. The third control power supply is configured to provide the third control voltage VK3 to the node control circuit 301 in the sense amplification stage, to achieve independent control on the sense amplification stage and the offset cancellation stage. Correspondingly, the second power supply circuit 300 further includes: a third strobe transistor <63>. One of a pair of source/drain terminals of the third strobe transistor <63> is coupled to the third control power supply, the other one of the pair of the source/drain terminals thereof is coupled to the node control circuit 301, and a gate thereof is coupled to the second processing circuit 404 and configured to receive a sixth selection signal. Specifically, the third strobe transistor <63> is turned on based on the sixth selection signal, to couple the third control power supply to the node control circuit 301. In some embodiments, the third control power supply may alternatively be the second control power supply. That is, the second control power supply is coupled to the node control circuit 301 in the sense amplification stage.

It should be noted that, the first strobe transistor <61>, the second strobe transistor <62>, and the third strobe transistor <63> may be NMOS tubes or PMOS tubes. Because the pull-down capability of the NMOS tubes is stronger than the pull-down capability of the PMOS tubes, the first strobe transistor <61>, the second strobe transistor <62>, and the third strobe transistor <63> are NMOS tubes in this embodiment.

Referring to FIG. 2 and FIG. 3, in this embodiment, the sense amplification circuit 101 includes: a first P-type transistor <P1>, a second P-type transistor <P2>, a first N-type transistor <N1> and a second N-type transistor <N2>. One of a pair of source drain terminals of the first P-type transistor <P1> is coupled to the first node PCS, the other one of the pair of source/drain terminals of the first P-type transistor <P1> is coupled to the complementary read node SABLB, and a gate of the first P-type transistor <P1> is coupled to the read node SABL. One of a pair of source/drain terminals of the second P-type transistor <P2> is coupled to the first node PCS, the other one of the pair of the source/drain terminals of the second P-type transistor <P2> is coupled to the read node SABL, and a gate of the second P-type transistor <P2> is coupled to the complementary read node SABLB. One of a pair of source/drain terminals of the first N-type transistor <N1> is coupled to the second node NCS, the other one of the pair of the source/drain terminals of the first N-type transistor <N1> is coupled to the complementary read node SABLB, and a gate of the first N-type transistor <N1> is coupled to the bit line BL. One of a pair of source/drain terminals of the second N-type transistor <N2> is coupled to the second node NCS, the other one of the pair of the source/drain terminals of the second N-type transistor <N2> is coupled to the read node SABL, and a gate of the second N-type transistor <N2> is coupled to the complementary bit line BLB.

Referring to FIG. 2 and FIG. 3, in this embodiment, the isolation circuit 102 includes: a first isolation transistor <11> and a second isolation transistor <12>. One of a pair of source/drain terminals of the first isolation transistor <11> is coupled to the bit line BL, the other one of the pair of the source/drain terminals of the first isolation transistor <11> is coupled to the read node SABL, and a gate of the first isolation transistor <11> is configured to receive an isolation signal ISO. The first isolation transistor <11> is configured to be turned on based on the isolation signal ISO in the sense amplification stave, to couple the read node SABL to the hit line BL. One of a pair of source/drain terminals of the second isolation transistor <12> is coupled to the complementary bit line BLB, the other one of the pair of the source/drain terminals of the second isolation transistor <12> is coupled to the complementary read node SABLB, and a gate of the second isolation transistor <12> is configured to receive the isolation signal ISO. The second isolation transistor <12> is configured to be turned on based on the isolation signal ISO in the sense amplification stage, to couple the complementary read node SABLB to the complementary hit line BLB.

Referring to FIG. 2 and FIG. 3, in this embodiment, the offset cancellation circuit 103 includes: a first offset cancellation transistor <21> and a second offset cancellation transistor <22>. One of a pair of source/drain terminals of the first offset cancellation transistor <21> is coupled to the bit line BL, the other one of the pair of the source/drain terminals of the first offset cancellation transistor <21> is coupled to the complementary read node SABLB, and a gate of the first offset cancellation transistor <21> is configured to receive an offset cancellation signal OC. The first offset cancellation transistor <21> is configured to be turned on based on the offset cancellation signal OC in the offset cancellation stage, to couple the complementary read node SABLB to the bit line BL. One of a pair of source/drain terminals of the second offset cancellation transistor <22> is coupled to the complementary bit line BLB, the other one of the pair of the source/drain terminals of the second offset cancellation transistor <22> is coupled to the read node SABL, and a gate of the second offset cancellation transistor <22> is configured to receive the offset cancellation signal OC. The second offset cancellation transistor <22> is configured to be turned on based on the offset cancellation signal OC in the offset cancellation stage, to couple the read node SABL to the complementary bit line BLB.

It should be noted that, the first isolation transistor <11>, the second isolation transistor <12>, the first offset cancellation transistor <21>, and the second offset cancellation transistor <22> may be NMOS tubes or PMOS tubes. The specific types of the first isolation transistor <11>, the second isolation transistor <12>, the first offset cancellation transistor <21>, and the second offset cancellation transistor <22> are not limited in this embodiment.

Referring to FIG. 2 and FIG. 3, in this embodiment, the amplification circuit further includes a preprocessing circuit 104 which is coupled to the read node SABL and the complementary read node SABLB. In a charging stage, the preprocessing circuit 104 is coupled to at least one of the read node SABL or the complementary read node SABLB and is configured to precharge the bit line BL, the complementary bit line BLB, the read lode SABL, and the complementary read node SABLB to a preset voltage Vdd based on a precharge signal PRE. In an equilibrium stage, the preprocessing circuit 104 is coupled to both of the read node SABL and the complementary read node SABLB, and is configured to synchronize a node voltage of the read node SABL and a node voltage of the complementary read node SABLB based on an equilibrium signal EQ.

It should be noted that, the preset voltage Vdd is an internal power supply voltage of the memory to which the amplification circuit belongs.

Specifically, the preprocessing circuit includes a charging transistor <31> and an equilibrium transistor <32>. One of a pair of source/drain terminals of the charging transistor <31> is coupled to the read node SABL or the complementary read node SABLB, the other one of the pair of the source/drain terminals of the charging transistor <31> is coupled to a node that provides the preset voltage Vdd, and a gate of the charging transistor <31> is configured to receive the precharge signal PRE. The charging transistor <31> is configured to be turned on based on the precharge signal PRE in the charging stage, to precharge the hit line BL, the complementary bit line BLB, the read node SABL, and the complementary read node SABLB to the preset voltage Vdd. One of a pair of source/drain terminals of the equilibrium transistor <32> is coupled to the read node SABL, the other one of the pair of the source/drain terminals of the equilibrium transistor <32> is coupled to the complementary read node SABLB, and a gate of the equilibrium transistor <32> is configured to receive the equilibrium signal EQ. The equilibrium transistor <32> is configured to be turned on based on the equilibrium signal EQ in the equilibrium stage, to synchronize the node voltage of the read node SABL and the node voltage of the complementary read node SABLB.

It should be noted that, the charging transistor <31> and the equilibrium transistor <32> may be NMOS tubes or PMOS tubes, and the specific types of the charging transistor <31> and the equilibrium transistor <32> are not limited in this embodiment.

In this embodiment, when other conditions are the same, higher memory temperature information indicates that the sense amplification circuit 101 can complete the offset cancellation and the sense amplification more quickly, and lower memory temperature information indicates that the sense amplification circuit 101 requires a longer time for completing the offset cancellation and the sense magnification. Correspondingly, when the memory temperature information increases, the magnitude of the power supply voltage provided to the first node PCS is reduced, to reduce the energy consumption in the offset cancellation stage; and when the memory temperature information decreases, the magnitude of the power supply voltage provided to the first node PCS is increased, to increase a voltage difference between the first node PCS and the second node NCS in the offset cancellation stage, so as to increase a rate at which the sense amplification circuit 101 generates a compensation voltage before performing voltage amplification. By adaptively adjusting the magnitude of the power supply voltage provided to the first node PCS according to the memory temperature information in the offset cancellation stage, dynamic adjustment on the offset cancellation time of the memory is implemented, which not only optimizes the performance of the memory, but also reduces the power consumption of the memory.

In addition, when other conditions are the same, higher memory temperature information indicates that the sense amplification circuit 101 can complete the offset cancellation and the sense amplification more quickly, and lower memory temperature information indicates that the sense amplification circuit 101 requires a longer time for completing the offset cancellation and the sense magnification. Correspondingly, when the memory temperature information increases, the pull-down capability of the second node NCS is reduced, to reduce the energy consumption in the offset cancellation stage; and when the memory temperature information decreases, the pull-down capability of the second node NCS is increased, to improve a rate at which the sense amplification circuit 101 generates a compensation voltage between before performing voltage amplification. By adaptively adjusting the pull-down capability of the second node NCS according to the memory temperature information in the offset cancellation stage, dynamic adjustment on the offset cancellation time of the memory is implemented, which not only optimizes the performance of the memory, but also reduces the power consumption of the memory.

It should be noted that, the characteristics disclosed in the amplification circuit provided in the foregoing embodiment may be arbitrarily combined without conflict, and a new embodiment of the amplification circuit can be obtained.

Another embodiment of this disclosure provides a control method, applied to the amplification circuit provided in the foregoing embodiment, to dynamically adjust a high-level voltage provided to a first node in an offset cancellation stage based on the temperature while ensuring the accuracy of offset cancellation, thereby optimizing the performance of the memory, and reducing the power consumption of the memory.

Figure 9:
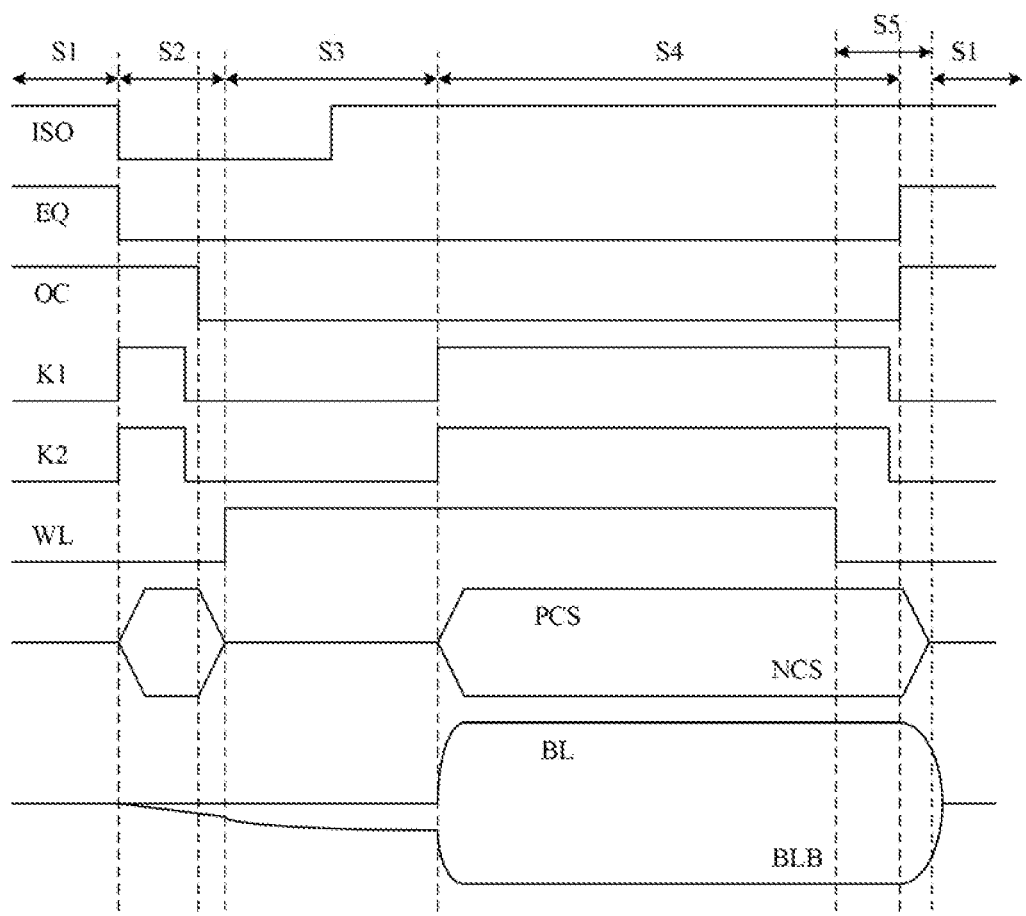
FIG. 9 is a schematic diagram of a time sequence of signals of an amplification circuit during data reading/writing according to another embodiment of this disclosure.
Figure 10:
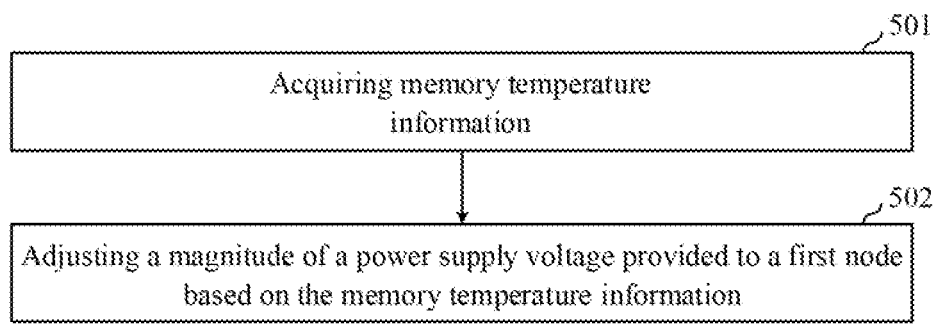
FIG. 10 is a schematic flowchart of a control method according to another embodiment of this disclosure.

FIG. 9 is a schematic diagram of a time sequence of signals of an amplification circuit during data reading/writing according to this embodiment; and FIG. 10 is a schematic flowchart of a control method according to this embodiment. The following further describes the control method provided in this embodiment in detail with reference to the accompanying drawings, which is specifically as follows.

Referring to FIG. 9 together with FIG. 2 and FIG. 3, for the amplification circuit provided in the foregoing embodiment:

In a stage S1, that is, the charging stage, the isolation signal ISO, the offset cancellation signal OC, and the equilibrium signal EQ are provided to couple the bit line BL, the complementary bit line BLB, the read node SABL, and the complementary read node SABLB to each other, and the precharge signal PRE is provided to precharge the bit line BL, the complementary bit line BLB, the read node SABL, and the complementary read node SABLB to the preset voltage Vdd.

It should be noted that, the preset voltage Vdd is an internal power supply voltage of the memory to which the amplification circuit belongs.

A stage S2, that is, the offset cancellation stage, is configured to eliminate the offset noise in the amplification circuit.

Specifically, referring to FIG. 10, in step 501, memory temperature information is acquired.

In step 502, a magnitude of a power supply voltage provided to a first node is adjusted based on the memory temperature information.

In some embodiments, that operation that the magnitude of the power supply voltage provided to the first node is adjusted according to the memory temperature includes that a magnitude of the resistance value of a first adjustment resistor coupled between a first power supply and the first node is adjusted based on the memory temperature information.

Specifically, referring to FIG. 4, the first transmission circuit 401 includes a first adjustment resistor 411, one end of the first adjustment resistor 411 is coupled to the first power supply, and the other end thereof is coupled to the first node PCS. The first transmission circuit 401 is configured to: change a magnitude of an resistance value of the first adjustment resistor 411 according to the first adjustment signal, and perform the voltage division on the first voltage V1 to provide the power supply voltage to the first node PCS. In some other embodiments, the first transmission circuit 401 is configured to perform a logical operation on the first adjustment signal, so as to select and control the magnitude of the voltage division on the first voltage V1, so as to perform the voltage division on the first voltage V1 to provide the power supply voltage to the first node PCS.

In some embodiments, the operation that the magnitude of the power supply voltage provided to the first node is adjusted according to the memory temperature information includes that: a preset temperature is acquired, if the memory temperature information is less than the preset temperature, the first power supply is used to supply power to the first node in the offset cancellation stage, and if the memory temperature information is greater than the preset temperature, a second power supply is used to supply power to the first node in the offset cancellation stage. A power supply voltage of the first power supply is higher than the power supply voltage of the second power supply.

Specifically, referring to FIG. 5, the first processing circuit 402 includes: a temperature acquisition subcircuit and the first processing subcircuit. The temperature acquisition subcircuit is configured to acquire the memory temperature information. The first processing subcircuit is coupled to the temperature acquisition subcircuit, the first node PCS, the first power supply, and the second power supply. The first processing subcircuit is configured to: if the memory temperature information is greater than a preset temperature, select and couple the second power supply to the first node PCS in the offset cancellation stage, and if the memory temperature information is less than the preset temperature, select and couple the first power supply to the first node PCS in the offset cancellation stage.

In some embodiments, step 502 further includes that a voltage of a second adjustment signal is adjusted according to the memory temperature information in the offset cancellation stage, where the second adjustment signal is configured to couple a ground node to a second node.

Specifically, in some embodiments, the operation that a voltage of a second adjustment signal is adjusted according to the memory temperature information in the offset cancellation stage includes that: a magnitude of a control power supply voltage provided to a node control circuit is adjusted according to the memory temperature information.

More specifically, referring to FIG. 6 and FIG. 7, the second transmission circuit 403 includes a second adjustment resistor 413, one end of the second adjustment resistor 413 is coupled to the first control power supply, and the other end thereof is coupled to the node control circuit 301. The second transmission circuit 403 is configured to: change a magnitude of an resistance value of the second adjustment resistor 413 according to the second adjustment signal, to perform voltage divide on the first control voltage VK1, so as to provide the pull-down control signal K2 to the node control circuit 301. In some other embodiments, the second transmission circuit 403 is configured to perform a logical operation on the second adjustment signal, so as to select and control the magnitude of the voltage division on the first control voltage VK1, so as to perform the voltage division on the first control voltage VK1 to provide the pull-down control signal K2 to the node control circuit 301.

Specifically, in some embodiments, the operation of the voltage of a second adjustment signal is adjusted according to the memory temperature information in the offset cancellation stage includes that: a preset temperature is acquired, if the memory temperature information is less than the preset temperature, the first control power supply is used to supply power to the node control circuit in the offset cancellation stage, and if the memory temperature information is greater than the preset temperature, a second control power supply is used to supply power to the node control circuit in the offset cancellation stage. A power supply voltage of the first control power supply is higher than a power supply voltage of the second control power supply.

More specifically, referring to FIG. 6 and FIG. 8, the second processing circuit 404 includes: a temperature acquisition subcircuit and a second processing subcircuit. The temperature acquisition subcircuit is configured to acquire the memory temperature information. The second processing subcircuit is coupled to the temperature acquisition subcircuit, the node control circuit 301, the first control power supply, and the second control power supply. The second processing subcircuit is configured to: if the memory temperature information is greater than a preset temperature, select and couple the second control power supply to the node control circuit 301 in the offset cancellation stage; and if the memory temperature information is less than the preset temperature, select and couple the first control power supply to the node control circuit 301 in the offset cancellation stage.

In a stage S3, that is, a charge sharing stage, a word line WL is turned on to turn on a corresponding storage unit, charges stored in the storage unit are shared to the bit line BL or the complementary bit line BLB, and then, based on the isolation signal ISO, the hit line BL is coupled to the read node SABL, and the complementary hit line BLB is coupled to the complementary read node SABLB.

A stage S4, that is, the sense amplification stage, is configured to amplify the voltage difference between the bit line and the complementary bit line BLB.

A stage S5, that is, the end of the sense amplification stage, is configured to read/write data.

It should be noted that the characteristics disclosed in the control method provided in the foregoing embodiment may be arbitrarily combined without conflict, and a new embodiment of the control method can be obtained.

In yet another embodiment of this disclosure, a memory is provided. The memory includes the amplification circuit provided in the foregoing embodiments. The amplification circuit is configured to perform a read/write operation of data, to dynamically adjust a high-level voltage provided to a first node in an offset cancellation stage based on the temperature while ensuring the accuracy of offset cancellation, thereby optimizing the performance of the memory, and reducing the power consumption of the memory.

Figure 11:
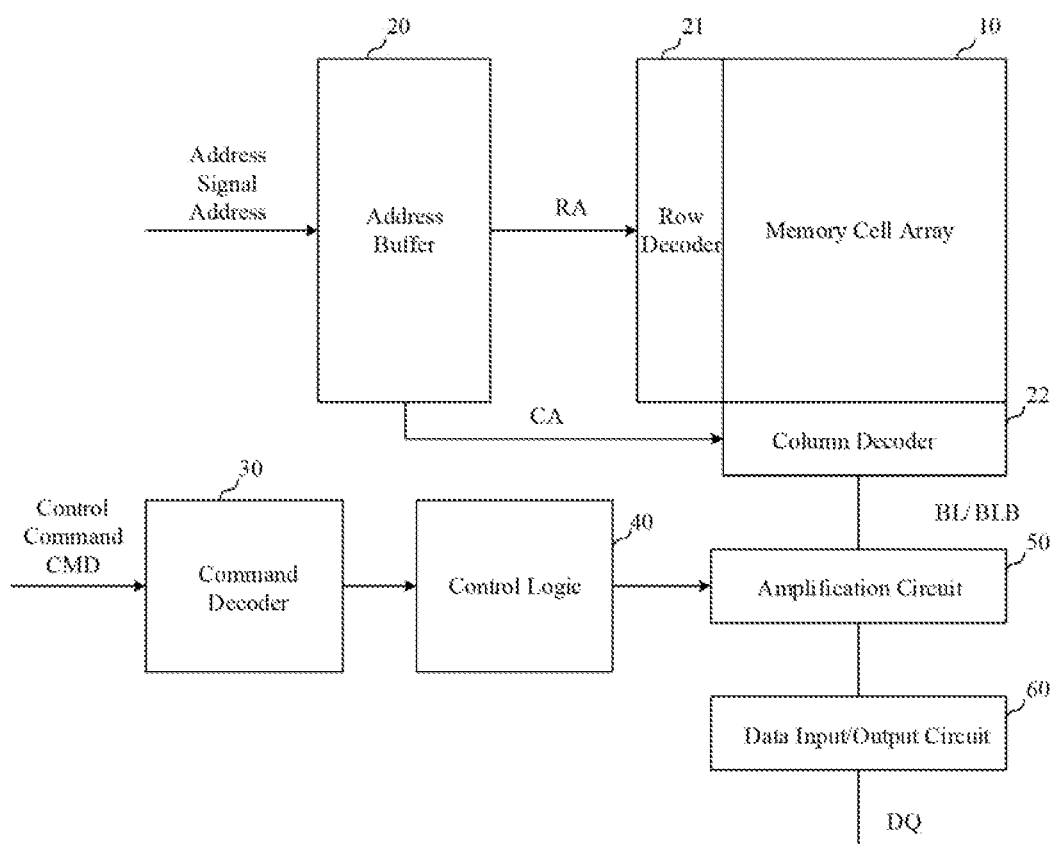
FIG. 11 is a schematic structural diagram of a memory according to vet another embodiment of this disclosure.

FIG. 11 is a schematic structural diagram of a memory according to this embodiment. The following further describes the memory provided in this embodiment in detail with reference to the accompanying drawings, which is specifically as follows:

Referring to FIG. 11, the memory may be a storage unit or a device based on a semiconductor device or component. For example, the memory device may be a volatile memory such as a DRAM, a synchronous DRAM (SDRAM), a double data rate synchronous DRAM (DDR SDRAM), a low power double data rate synchronous DRAM (LPDDR SDRAM), a graphics double data rate synchronous DRAM (GDDR SDRAM), a double data rate 2 synchronous DRAM (DDR2 SDRAM), a double data rate 3 synchronous DRAM (DDR3 SDRAM), a double data rate 4 synchronous DRAM (DDR4 SDRAM), or a thyristor random access memory (TRAM); or may be non-volatile memory, such as a phase-change random access memory (PRAM), a magnetic random access memory (MRAM), or a resistive random access memory (RRAM).

The memory device may input/output data by using a data line DQ in response to a control command CMD and an address signal Address received from an external device such as a memory controller. The memory device includes a memory cell array 10, a command decoder 30, a control logic 40, an address buffer 20, a row decoder 21, a column decoder 22, an amplification circuit 50, and a data input/output circuit 60.

The memory cell array 10 includes a plurality of memory cells provided in a matrix arranged in rows and columns. The memory cell array 10 includes a plurality of word lines WL and a plurality of bit lines BL connected to the memory cells. The plurality of word lines WL may be connected to the rows of memory cells, and the plurality of bit lines BL may be connected to the columns of the memory cells.

The command decoder 30 may decode a write enable signal /WE, a row address strobe signal /RAS, a column address strobe signal /CAS, a chip select signal/CS, and the like received from an external device such as a memory controller, and may allow the control logic 40 to generate a control signal corresponding to the control command CMD.

The control command CMD may include an activation command, a read command, a write command, a precharge command, and the like.

The address buffer 20 receives the address signal Address from the memory controller as an external device. The address signal Address includes row addresses RA for addressing the rows of the memory cell array 10 and column addresses CA for addressing the columns of the memory cell array 10. The address buffer 120 may send the row addresses RA to the row decoder 21 and the column addresses CA to the column decoder 22.

The row decoder 21 may select any one of the plurality of word lines WL connected to the memory cell array 10. The row decoder 21 may decode a row address RA received from the address buffer 120, select any word line corresponding to the row address RA, and activate the selected word line WL.

The column decoder 22 may select a predetermined quantity of bit lines from the plurality of bit lines BL of the memory cell array 10. The column decoder 22 may decode the column addresses CA received from the address buffer 120 and select a predetermined quantity of bit lines BL corresponding to the received column addresses CA.

The amplification circuit 50 is connected to the bit lines BL of the memory cell array 10. The amplification circuit 50 may read out a change in a voltage of a bit line selected from the plurality of bit BL, amplify the voltage change, and output the amplified voltage change.

The data input/output circuit 60 may output data by using the data line DQ based on the voltage read and amplified by the amplification circuit 50.

The amplification circuit 50 may receive an isolation signal ISO, an offset cancellation signal OC, and the like from the control logic 40. The amplification circuit 50 may perform an offset cancellation operation in response to the isolation signal ISO and the offset cancellation signal OC. For example, the offset represents a characteristic difference between semiconductor devices constituting the amplification circuit 50, for example, a difference between threshold voltages of different semiconductor devices.

A person of ordinary skill in the art can understand that the foregoing embodiments are specific embodiments for implementing this disclosure, and in an actual application, various changes can be made in forms and details without departing from the spirit and scope of this disclosure.

The invention claimed is:

1. An amplification circuit, coupled to a bit line and a complementary bit line, and comprising:
   a sense amplification circuit, comprising a read node, a complementary read node, a first node, and a second node, wherein in a sense amplification stage and an offset cancellation stage, the first node is configured to receive a high level, and the second node is configured to receive a low level;
   an isolation circuit, coupled to the read node, the complementary read node, the bit line, and the complementary bit line, wherein the isolation circuit is configured to: in the sense amplification stage, couple the read node to the bit line and couple the complementary read node to the complementary bit line;

an offset cancellation circuit, coupled to the bit line, the complementary bit line, the read node, and the complementary read node, wherein the offset cancellation circuit is configured to: in the offset cancellation stage, couple the bit line to the complementary read node and couple the complementary bit line to the read node; and a first power supply circuit, coupled to the first node, and configured to: acquire memory temperature information, and in the offset cancellation stage, adjust, according to the memory temperature information, a magnitude of a power supply voltage provided to the first node;

wherein the first power supply circuit comprises:

a first power supply, configured to provide a first voltage;

a first transmission circuit, one end of the first transmission circuit being coupled to the first power supply, and the other end of the first transmission circuit being coupled to the first node, wherein the first transmission circuit is configured to perform voltage division on the first voltage to provide the power supply voltage to the first node; and a first processing circuit, coupled to the first transmission circuit, wherein the first processing circuit is configured to: acquire the memory temperature information, and in the offset cancellation stage, adjust, using a first adjustment signal according to the memory temperature information, a magnitude of the voltage division performed by the first transmission circuit on the first voltage; or, wherein the first power supply circuit comprises:

a first power supply, configured to provide a first voltage;

a second power supply, configured to provide a second voltage, the first voltage being higher than the second voltage; and a first processing circuit, coupled to the first node, the first power supply, and the second power supply, wherein the first processing circuit is configured to: acquire the memory temperature information, and in the offset cancellation stage, select and couple, according to the memory temperature information, the first power supply or the second power supply to the first node.

2. The amplification circuit according to claim 1, wherein the first transmission circuit comprises a first adjustment resistor, one end of the first adjustment resistor being coupled to the first power supply, and the other end of the first adjustment resistor being coupled to the first node, wherein the first transmission circuit is configured to: change a magnitude of an resistance value of the first adjustment resistor according to the first adjustment signal to perform the voltage division on the first voltage, so as to provide the power supply voltage to the first node.

3. The amplification circuit according to claim 1, wherein the first processing circuit comprises:

a temperature acquisition subcircuit, configured to acquire the memory temperature information;

a first configuration circuit, storing a correspondence between the memory temperature information and adjustment parameters, the adjustment parameters being configured to control the magnitude of the voltage division performed by the first transmission circuit on the first voltage; and a first processing subcircuit, coupled to the temperature acquisition subcircuit, the first configuration circuit, and the first transmission circuit, wherein the first processing subcircuit is configured to: acquire an adjustment parameter based on the memory temperature information and the correspondence, and configure the first adjustment signal based on the adjustment parameter, to control the first transmission circuit.

4. The amplification circuit according to claim 1, wherein the first processing circuit comprises:

a temperature acquisition subcircuit, configured to acquire the memory temperature information;

a first configuration circuit, storing a correspondence between intervals to which the memory temperature information belongs to and adjustment parameters, the adjustment parameter being configured to control the magnitude of the voltage division performed by the first transmission circuit on the first voltage; and a first processing subcircuit, coupled to the temperature acquisition subcircuit, the first configuration circuit, and the first transmission circuit, wherein the first processing subcircuit is configured to: acquire an adjustment parameter based on the memory temperature information and the correspondence, and configure the first adjustment signal based on the adjustment parameter, to control the first transmission circuit.

5. The amplification circuit according to claim 1, wherein the first processing circuit comprises:

a temperature acquisition subcircuit, configured to acquire the memory temperature information; and a first processing subcircuit, coupled to the temperature acquisition subcircuit, the first node, the first power supply, and the second power supply, wherein the first processing subcircuit is configured to: if the memory temperature information is greater than a preset temperature, select and couple the second power supply to the first node in the offset cancellation stage; and if the memory temperature information is less than the preset temperature, select and couple the first power supply to the first node in the offset cancellation stage.

6. The amplification circuit according to claim 1, wherein the first power supply circuit further comprises a third power supply, configured to provide a third voltage, wherein the third power supply is configured to provide the third voltage to the first node in the sense amplification stage.

7. The amplification circuit according to claim 1, further comprising:

a node control circuit, coupled to the second node and a ground node, wherein the node control circuit is configured to couple the second node to the ground node in the offset cancellation stage and the sense amplification stage; and a second power supply circuit, coupled to the node control circuit, and configured to: acquire the memory temperature information, and in the offset cancellation stage, control, according to the memory temperature information, the node control circuit to couple the second node to the ground node.

8. The amplification circuit according to claim 7, wherein the second power supply circuit comprises:

a first control power supply, configured to provide a first control voltage; a second transmission circuit, one end of the second transmission circuit being coupled to the first control power supply, and the other end of the second transmission circuit being coupled to the second node, wherein the second transmission circuit is configured to perform voltage division on the first control voltage; and a second processing circuit, coupled to the second transmission circuit, wherein the second processing circuit is configured to: acquire the memory temperature information, and in the offset cancellation stage, adjust, using a second adjustment signal according to the memory temperature information, a magnitude of the voltage division performed by the second transmission circuit on the first control voltage.

9. The amplification circuit according to claim 7, wherein the second power supply circuit comprises:
a first control power supply, configured to provide a first control voltage;
a second control power supply, configured to provide a second control voltage, the first control voltage being higher than the second control voltage; and
a second processing circuit, coupled to the first control power supply, the second control power supply, and the node control circuit, wherein the second processing circuit is configured to: acquire the memory temperature information, and in the offset cancellation stage, select and couple, according to the memory temperature information, the first control power supply or the second control power supply to the second node.

10. A control method, applied to the amplification circuit according to claim 1, the method comprising:
acquiring memory temperature information; and
in an offset cancellation stage, adjusting, according to the memory temperature information, a magnitude of a power supply voltage provided to a first node;
wherein the adjusting, according to the memory temperature information, the magnitude of the power supply voltage provided to a first node comprises:
adjusting, based on the memory temperature information, a magnitude of a resistance value of a first adjustment resistor coupled between a first power supply and the first node; or
acquiring a preset temperature, if the memory temperature information is less than the preset temperature, using the first power supply to supply power to the first node in the offset cancellation stage, and if the memory temperature information is greater than the preset temperature, using a second power supply to supply power to the first node in the offset cancellation stage, wherein a power supply voltage of the first power supply is higher than a power supply voltage of the second power supply.

11. The control method according to claim 10, further comprising:
adjusting a voltage of a second adjustment signal according to the memory temperature information in the offset cancellation stage.

12. A memory, comprising an amplification circuit, wherein the amplification circuit is configured to perform a read/write operation of data and comprises:
a sense amplification circuit, comprising a read node, a complementary read node, a first node, and a second node, wherein in a sense amplification stage and an offset cancellation stage, the first node is configured to receive a high level, and the second node is configured to receive a low level;
an isolation circuit, coupled to the read node, the complementary read node, the bit line, and the complementary bit line, wherein the isolation circuit is configured to: in the sense amplification stage, couple the read node to the bit line and couple the complementary read node to the complementary bit line;
an offset cancellation circuit, coupled to the bit line, the complementary bit line, the read node, and the complementary read node, wherein the offset cancellation circuit is configured to: in the offset cancellation stage, couple the bit line to the complementary read node and couple the complementary bit line to the read node; and
a first power supply circuit, coupled to the first node, and configured to: acquire memory temperature information, and in the offset cancellation stage, adjust, according to the memory temperature information, a magnitude of a power supply voltage provided to the first node;
wherein the first power supply circuit comprises:
a first power supply, configured to provide a first voltage;
a first transmission circuit, one end of the first transmission circuit being coupled to the first power supply, and the other end of the first transmission circuit being coupled to the first node, wherein the first transmission circuit is configured to perform voltage division on the first voltage to provide the power supply voltage to the first node; and
a first processing circuit, coupled to the first transmission circuit, wherein the first processing circuit is configured to: acquire the memory temperature information, and in the offset cancellation stage, adjust, using a first adjustment signal according to the memory temperature information, a magnitude of the voltage division performed by the first transmission circuit on the first voltage; or, wherein the first power supply circuit comprises:
a first power supply, configured to provide a first voltage;
a second power supply, configured to provide a second voltage, the first voltage being higher than the second voltage; and
a first processing circuit, coupled to the first node, the first power supply, and the second power supply,
wherein the first processing circuit is configured to: acquire the memory temperature information, and in the offset cancellation stage, select and couple, according to the memory temperature information, the first power supply or the second power supply to the first node.

13. The memory according to claim 12, wherein
the first transmission circuit comprises a first adjustment resistor, one end of the first adjustment resistor being coupled to the first power supply, and the other end of the first adjustment resistor being coupled to the first node, wherein the first transmission circuit is configured to: change a magnitude of an resistance value of the first adjustment resistor according to the first adjustment signal to perform the voltage division on the first voltage, so as to provide the power supply voltage to the first node.

14. The memory according to claim 12, wherein the first processing circuit comprises:
a temperature acquisition subcircuit, configured to acquire the memory temperature information;
a first configuration circuit, storing a correspondence between the memory temperature information and adjustment parameters, the adjustment parameters being configured to control the magnitude of the voltage division performed by the first transmission circuit on the first voltage; and
a first processing subcircuit, coupled to the temperature acquisition subcircuit, the first configuration circuit, and the first transmission circuit, wherein the first processing subcircuit is configured to: acquire an adjustment parameter based on the memory temperature information, and configure the first adjustment signal based on the adjustment parameter, to control the first transmission circuit.

15. The memory according to claim 12, wherein the first processing circuit comprises:
- a temperature acquisition subcircuit, configured to acquire the memory temperature information;
- a first configuration circuit, storing a correspondence between intervals to which the memory temperature information belongs to and adjustment parameters, the adjustment parameter being configured to control the magnitude of the voltage division performed by the first transmission circuit on the first voltage; and
- a first processing subcircuit, coupled to the temperature acquisition subcircuit, the first configuration circuit, and the first transmission circuit, wherein the first processing subcircuit is configured to: acquire an adjustment parameter based on the memory temperature information and the correspondence, and configure the first adjustment signal based on the adjustment parameter, to control the first transmission circuit.

* * * * *